United States Patent
Lou

(10) Patent No.: US 8,188,758 B2
(45) Date of Patent: May 29, 2012

(54) ENCLOSED PROBE STATION

(75) Inventor: Choon Leong Lou, Hsinchu (TW)

(73) Assignee: Star Technologies, Inc., Hsinchu (TW)

( * ) Notice: Subject to any disclaimer, the term of this patent is extended or adjusted under 35 U.S.C. 154(b) by 335 days.

(21) Appl. No.: 12/552,029

(22) Filed: Sep. 1, 2009

(65) Prior Publication Data

US 2010/0052716 A1   Mar. 4, 2010

(30) Foreign Application Priority Data

Sep. 4, 2008 (TW) ................................ 97133855 A

(51) Int. Cl.
*G01R 1/067* (2006.01)
(52) U.S. Cl. .................................................. 324/755.01
(58) Field of Classification Search .................... None
See application file for complete search history.

(56) References Cited

U.S. PATENT DOCUMENTS

| | | | | |
|---|---|---|---|---|
| 1,923,308 A * | 8/1933 | Heinmuller | ................... | 368/286 |
| 5,091,694 A * | 2/1992 | Ikeda et al. | .............. | 324/750.25 |
| 5,959,461 A * | 9/1999 | Brown et al. | ............... | 324/750.2 |
| 8,035,405 B2 * | 10/2011 | Lou | ........................... | 324/750.03 |
| 2005/0193576 A1 * | 9/2005 | Hollman et al. | ................. | 33/286 |
| 2005/0225347 A1 | 10/2005 | Khandros et al. | | |
| 2007/0030021 A1 * | 2/2007 | Cowan et al. | .................. | 324/760 |
| 2007/0247178 A1 * | 10/2007 | Dunklee et al. | ............... | 324/754 |
| 2008/0042680 A1 * | 2/2008 | Cowan et al. | .................. | 324/760 |
| 2008/0106290 A1 * | 5/2008 | Harwood et al. | ............. | 324/754 |
| 2010/0052720 A1 * | 3/2010 | Lou | ............................... | 324/760 |

FOREIGN PATENT DOCUMENTS

TW     200636264 A     10/2006

OTHER PUBLICATIONS

Office Action issued on Jan. 5, 2012 from Taiwan counterpart application 097133855.

* cited by examiner

*Primary Examiner* — Jermele M Hollington
(74) *Attorney, Agent, or Firm* — WPAT, P.C.; Anthony King

(57) ABSTRACT

An enclosed probe station comprises a chuck assembly, a supporting member and an enclosure. The chuck assembly is configured to support a device under test. The supporting member is configured to secure a probe used to contact the device under test. The enclosure forms an interior space in which the chuck assembly and the supporting member are disposed.

10 Claims, 5 Drawing Sheets

ENCLOSED PROBE STATION

BACKGROUND OF THE INVENTION

1. Field of the Invention

The present invention relates to a probe station, and more particularly, to an enclosed type probe station.

2. Description of the Related Art

FIG. 1 shows a prior probe station 100. When the prior probe station 100 performs an electricity test on a device under test 102, the device under test 102, chuck assembly 104 and test probe (not shown) are exposed in an exterior environment. Because the prior probe station 100 is not covered or shielded, it is likely to suffer from Electromagnetic Interference (EMI) and results in test errors when a low current and high frequency test is performed. With the development towards low current and high frequency, the prior probe station 100 will therefore be unable to satisfy future industry demands.

Currently the solution by which the industry resolves the EMI problem is to cover the device under test 102 and the chuck station 104 with an enclosure that provides EMI shielding effect. To deal with the structure of the probe system or connection between driving devices of the chuck assembly, it is necessary to place some openings on the enclosure, and the openings need to add suitable additions to ensure effective EMI shielding. However, such requirements make the mechanical design more complex and increase the maintenance cost and efforts. In addition, although the boundary of the openings is sealed, the shield may still allow some electromagnetic wave leakage. Furthermore, during the electricity test period, if there are related motions between devices in the exterior of the enclosure, it is necessary to add some covering mechanism to provide complete protection. As such, the total cost is high and the working flow is complicated.

In conclusion, with the development trends toward low current and high frequency, it is necessary to develop a simple design that is capable of providing better EMI shielding effect.

SUMMARY OF THE INVENTION

An enclosed probe station in accordance with one embodiment of the present invention comprises a chuck assembly, a supporting member and an enclosure. The chuck assembly is configured to support a device under test. The supporting member is configured to secure a probe used to contact the device under test. The enclosure forms an interior space in which the chuck assembly and the supporting member are disposed.

An enclosed probe station in accordance with one embodiment of the present invention comprises a chuck assembly, a probe socket and an enclosure. The chuck assembly is configured to support a device under test. The probe socket is disposed on a guidance member for securing a probe used to contact the device under test. The enclosure forms an interior space in which the chuck assembly, the probe socket and the guidance member are disposed.

BRIEF DESCRIPTION OF THE DRAWINGS

The invention will be described according to the appended drawings in which.

PREFERRED EMBODIMENT OF THE PRESENT INVENTION

The present invention discloses an enclosed station, which includes an EMI-shielding enclosure so that devices under test are free from outside EMI effect when conducting electricity tests. The housing has an electrically connecting member, which provides signal transmissions between the probe and outside of the housing so that it is not necessary to provide openings for the probes in the housing. In addition, because the probe does not extend outside of the housing, it is not necessary to additionally provide a flexible enclosed mechanism when moving for shielding extending portions. Therefore, the present invention has advantages of simplicity, low cost and safer EMI protection due to fewer openings.

Figure 1:
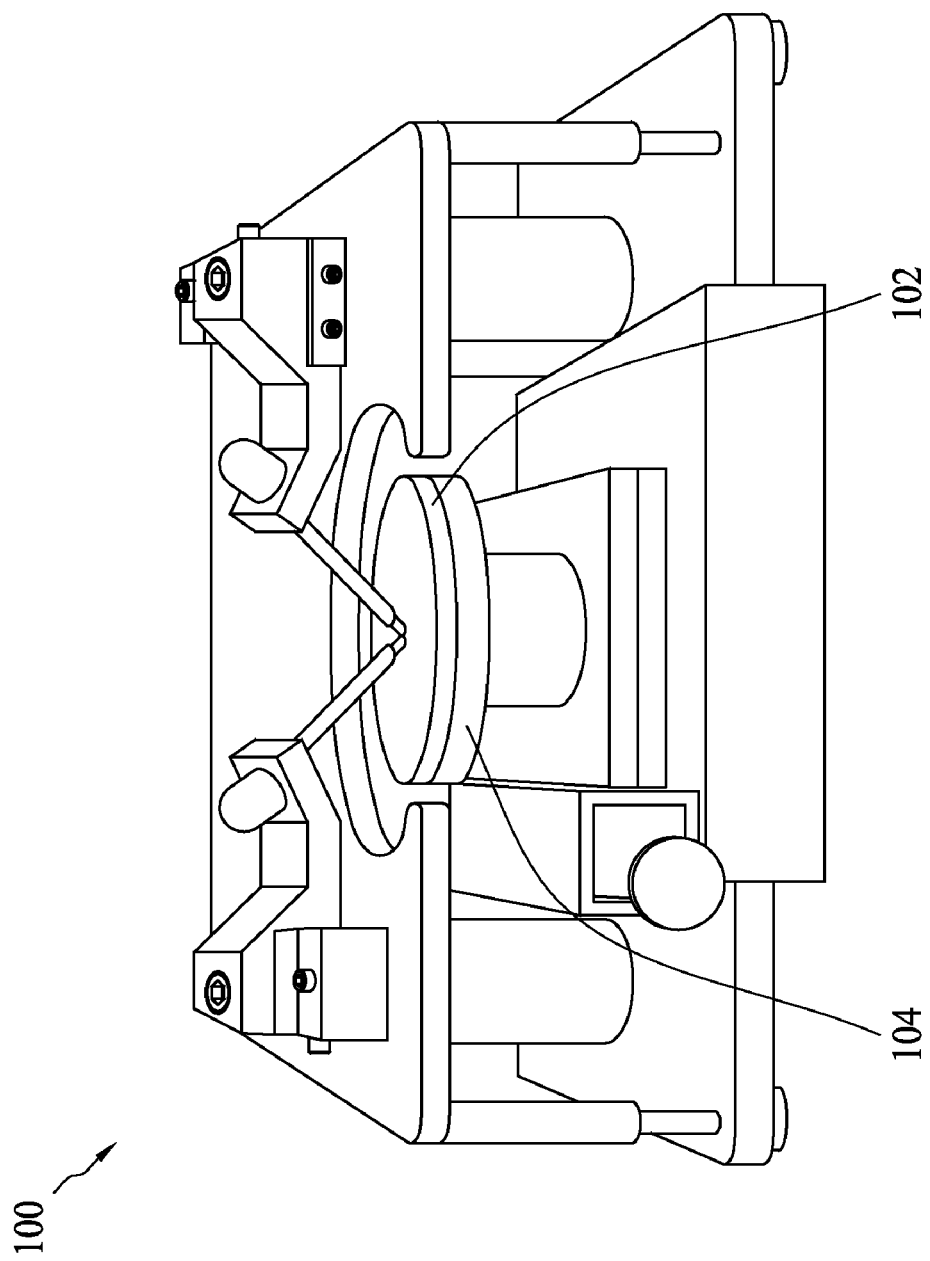
FIG. 1 shows a prior probe station.
Figure 2:
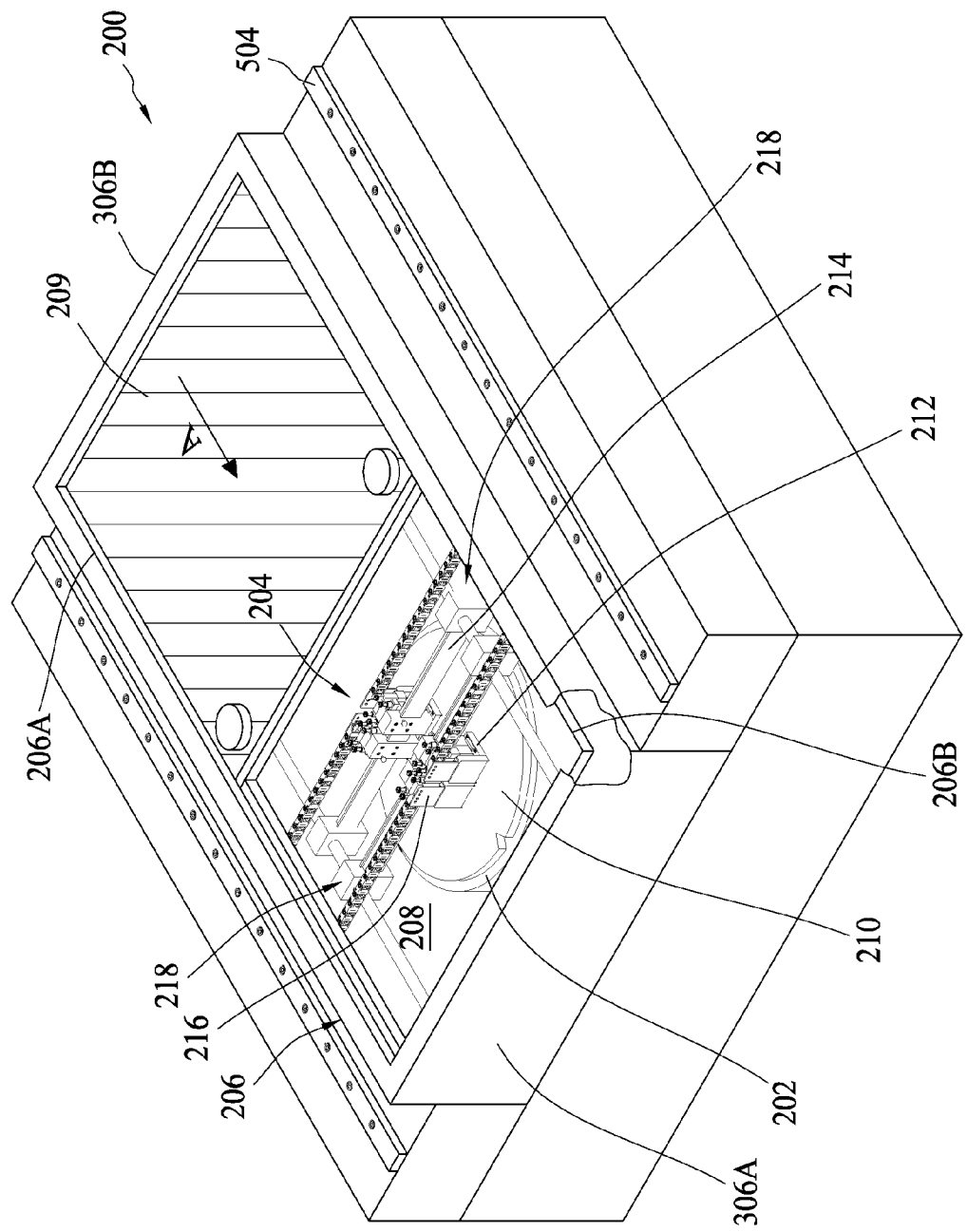
FIGS. 2 and 3 show an enclosed probe station in accordance with one embodiment of the present invention.
Figure 3:
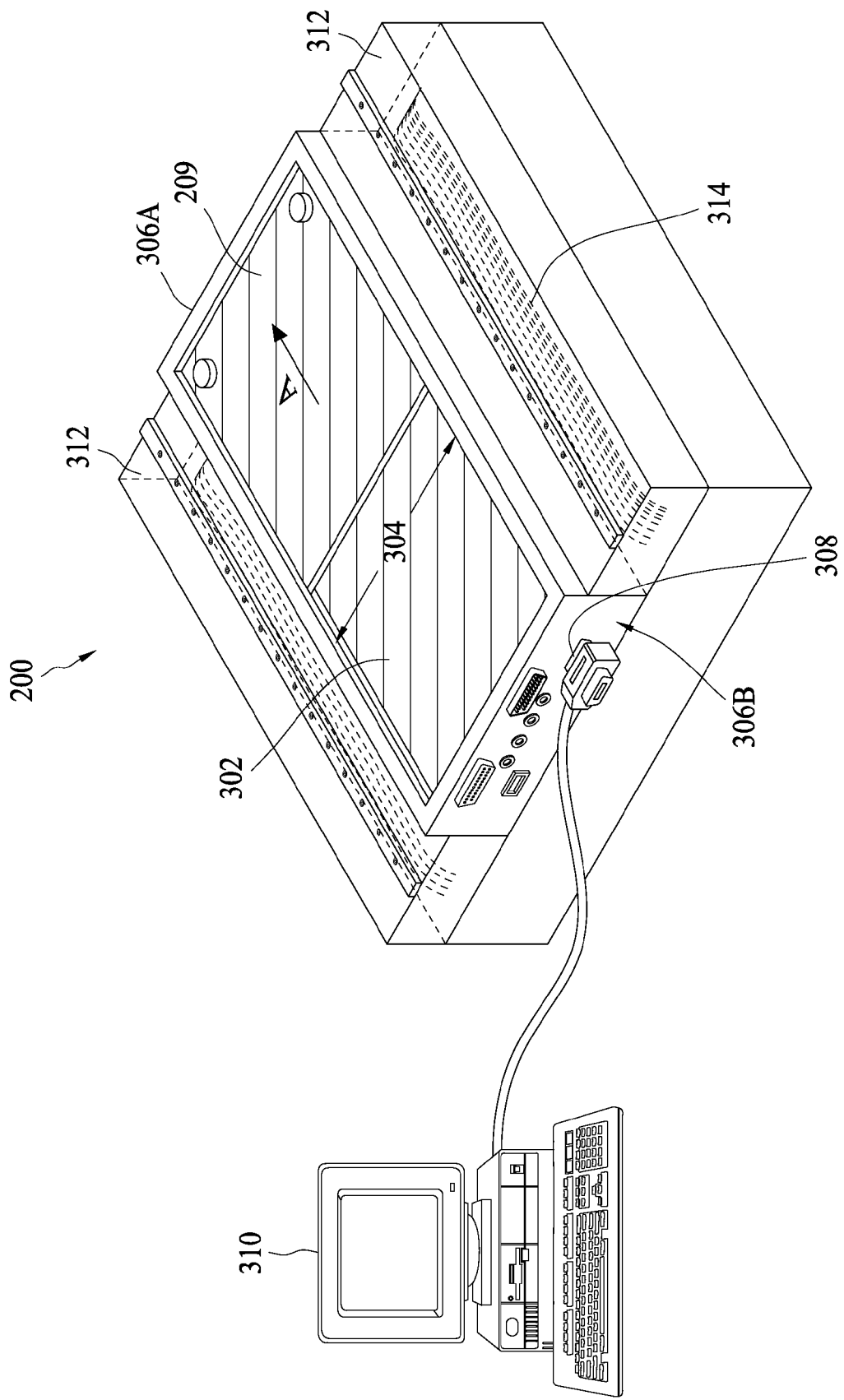

FIGS. 2 and 3 show an enclosed probe station 200 in accordance with one embodiment of the present invention. Referring to FIG. 2, the enclosed probe station comprises a chuck assembly 202, a supporting member 204 and an enclosure 206. The chuck assembly 202 is used to support a device under test 210, which may be semiconductor components on a wafer. The supporting member 204 is used to support a probe (not shown) for contacting the devices under test 210, while the probe may be included in a probe card 212 shown in FIG. 4. In addition, the enclosed probe station 200 may include a microscope assembly 500 shown in FIG. 5 for observing the relative position of the probe card 212 and the device under test 210.

The enclosure 206 includes a housing 206A and a transparent cover 206B defining an interior space 208, in which the chuck assembly 202 and the supporting member 204 are disposed. The size of the transparent cover 206B is designed to show the entire the device under test 210 such that the user can observe the relative position of the probe card 212 and the device under test 210 by moving the object lens of the microscope assembly 500. There is no need for any other opening in the enclosure. When the slide cover 209 is closed (as shown in direction A), the internal space in the enclosure 206 maintains a controlled testing environment with constant temperature, etc. The housing 206A of the enclosure 206 can be made of materials capable of shielding against electromagnetic interference, which may be metal with a high permeability, conductive composite material or other materials featuring the similar functions. Because the enclosure 206 completely covers the device, the EMI shielding effect is much better than that provided by the prior art.

In one embodiment of the present invention, the supporting member 204 includes a guidance member 214, a probe socket 216 used to secure a probe and disposed on the guidance member 214, and a moving member 218 for moving the guidance member 214. The probe socket 216 is secured on the guidance member 214 and moves along the guidance direction, thereby adjusting relative positions to measure the device under test 210 in different positions. In one embodiment, the guidance member 214 is a slide rail.

Two ends of the guidance member 214 are disposed on the moving member 218, which pushes the probe socket 216 to move in other directions different from the direction followed by the guidance member 214. Therefore, the probe socket 216 can arbitrarily move on the chuck assembly 202. The moving member 218 not only adjusts the position of the probe socket 216, but also provides a convenient way to easily access the device under test 210 on the chuck assembly 202 when the probe socket 216 is moved away. In one embodiment, the moving member 218 pushes the probe socket 216 to move in the direction perpendicular to the direction followed by the guidance member 214. In one embodiment, the enclosed probe station 200 is configured with at least one set of supporting members 204 and at least one set of probe sockets 216 thereon to achieve the purpose of parallel testing.

Referring to FIG. 3, the slide cover 209 is cascaded on the transparent cover 206B, and a back plate 302 at the side of the transparent cover 206B emerges. The slide cover 209 is designed to move along a slide rail 304. The housing 206 includes a front surface 306A and a back surface 306B equipped with an electrical connecting member 308, by which the test signals of the probe or control signals of the test signals conduct electrical connection to a test system 310 outside the enclosure 206. By such design, openings on the enclosed probe station 200 are largely reduced and better EMI shielding is achieved. In one embodiment, the electrically connecting member 308 is a GPIB (IEEE 488) interface, and two sides of the enclosed probe station 200 include a side area 312, which contains air ducts for controlling temperature and signal lines 314.

Figure 4:
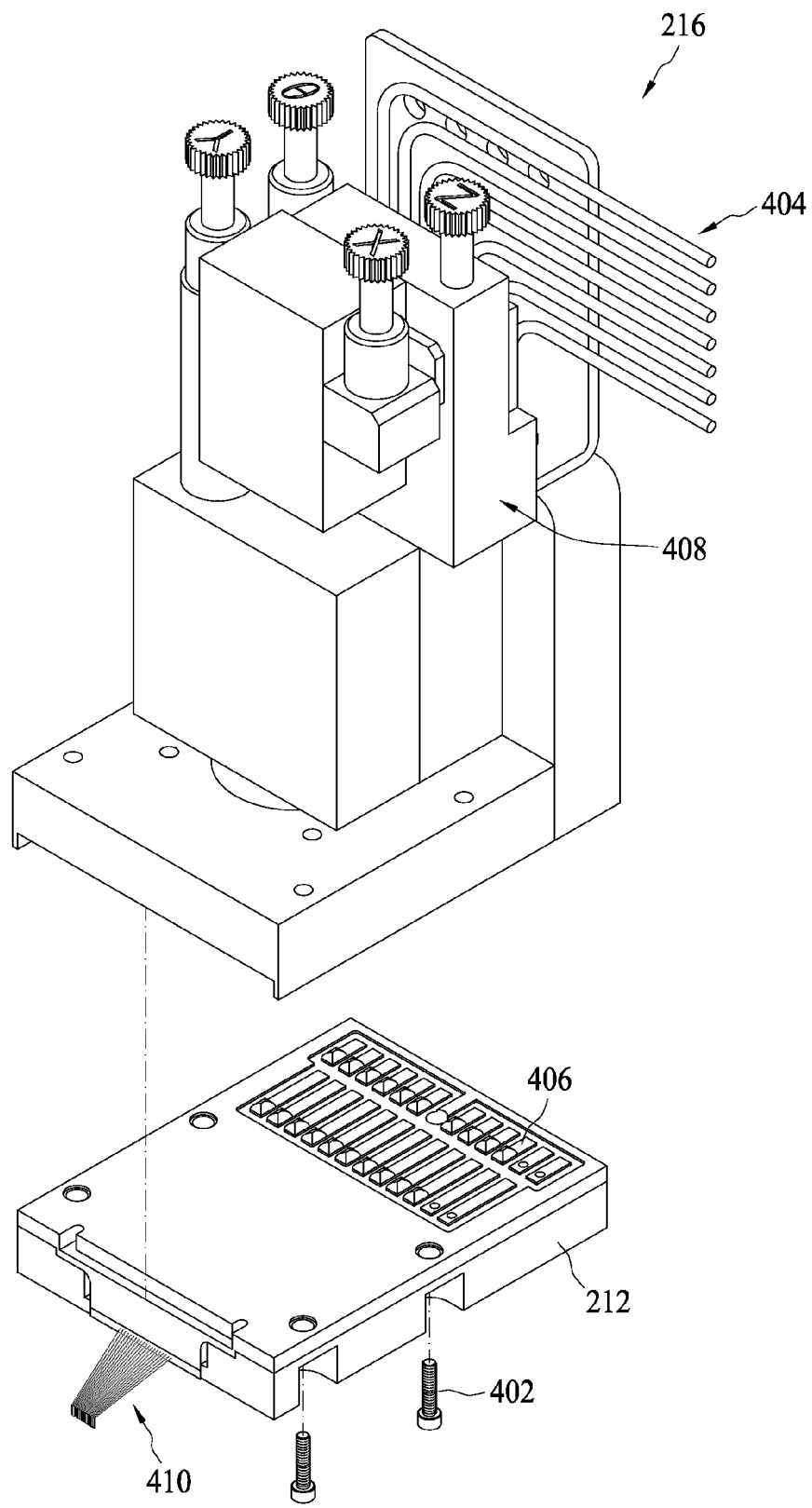
FIG. 4 shows a probe socket in accordance with one embodiment of the present invention.

FIG. 4 shows a probe socket 216 in accordance with one embodiment of the present invention. In one embodiment, the probe card 212 is secured on the bottom of the probe socket 216 by screws 402 or other members having the similar function, and the electrodes 406 are electrically connected to terminals of cable lines 404. The probe socket 216 includes four-axis adjustable member 408 whose X, Y, Z and θ axes can be adjusted, by which the position and angle of the probe 410 on the probe card 212 can be further adjusted.

Figure 5:
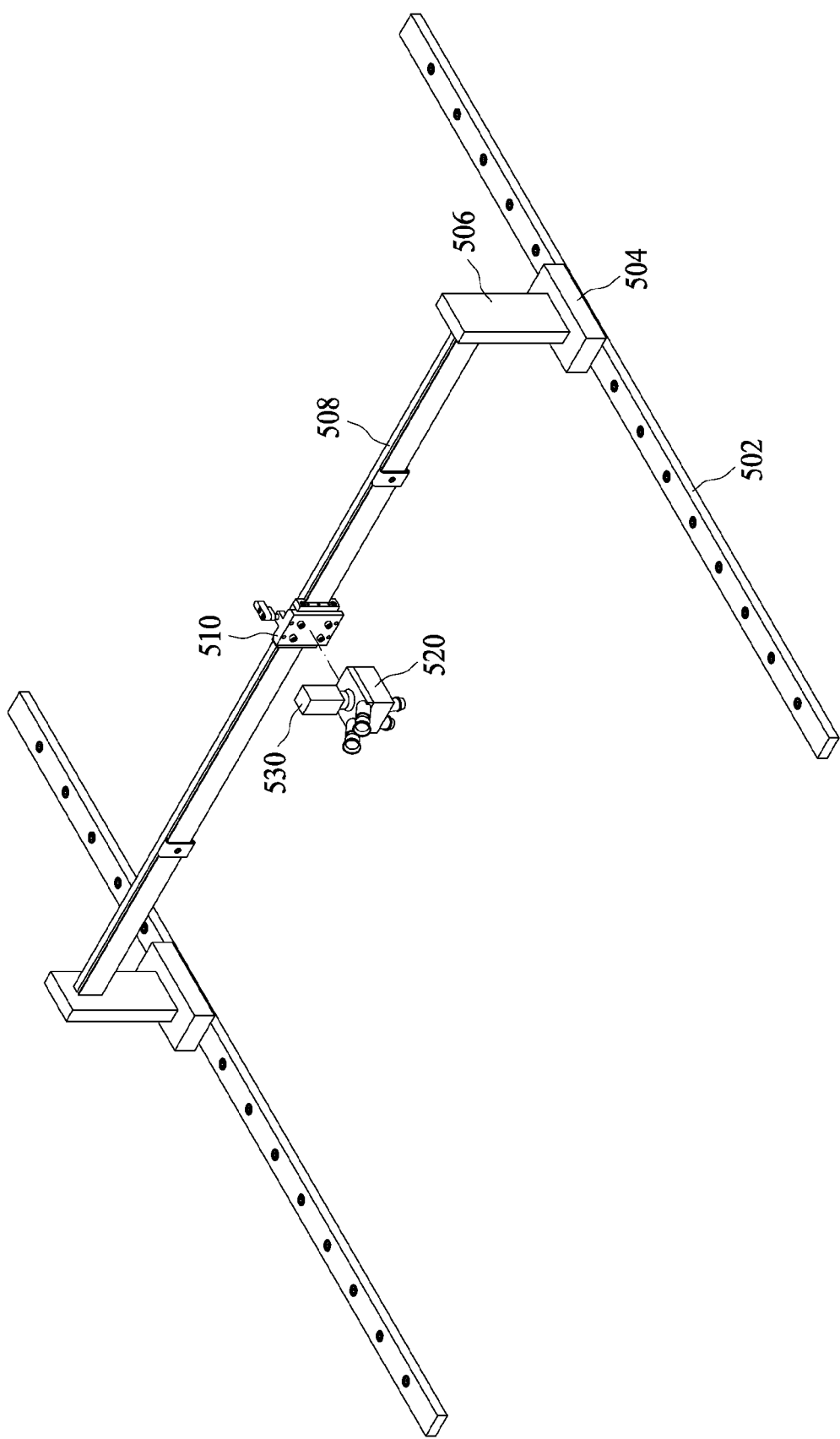
FIG. 5 illustrates a microscope assembly in accordance with one embodiment of the present invention.

Referring to FIG. 2 and FIG. 5, the microscope assembly 500 includes two slide rails 502, two slide bases 504 on the slide rails 502, two pillars 506 on the slide bases 504, a slide rail 508 on the pillars 506, a lateral sliding module 510 on the slide rail 508, a microscope 520 on the lateral sliding module 510, and an image-capturing device 530 on the microscope 520. The slide base 504 is designed to be movable on the slide rails 502 to change the relative position of the microscope 520 to the device under test 210 along a first direction. The lateral sliding module 510 is designed to be movable on the slide rail 508 to change the relative position of the microscope 520 to the device under test 210 along a second direction. The image captured by the image-capturing device 530 can be transmitted to an external display by wires not shown in the drawings, and the user can observe the relative position between the probe card 212 and the device under test 210 on the display.

The above-described embodiments of the present invention are intended to be illustrative only. Numerous alternative embodiments may be devised by persons skilled in the art without departing from the scope of the following claims.

What is claimed is:

1. An enclosed probe station, comprising:
   a chuck assembly configured to support a device under test;
   a supporting member configured to secure a probe used to contact the device under test; and
   an enclosure forming an interior space in which the chuck assembly and the supporting member are disposed;
   wherein the enclosure comprises an electrically connecting member disposed thereon, and the electrically connecting member provides signal transmissions between the probe and outside of the enclosure;
   wherein the enclosure comprises a slide cover for protecting the device under test;
   wherein the enclosure comprises a transparent cover for observing the position of the device under test.

2. The enclosed probe station of claim 1, wherein the enclosure is made of materials capable of shielding against electromagnetic interference.

3. The enclosed probe station of claim 1, wherein the supporting member comprises a four-axis adjustable device for adjusting the probe.

4. The enclosed probe station of claim 1, further comprising a microscope assembly 500 configured to observe the position of the device under test through the transparent cover.

5. An enclosed probe station, comprising:
   a chuck assembly configured to support a device under test;
   a probe socket disposed on a guidance member for securing a probe used to contact the device under test; and
   an enclosure forming an interior space in which the chuck assembly, the probe socket and the guidance member are disposed;
   wherein the enclosure comprises an electrically connecting member disposed thereon, and the electrically connecting member provides signal transmissions between the probe and outside of the enclosure;
   wherein the enclosure comprises a slide cover for protecting the device under test;
   wherein the enclosure comprises a transparent cover for observing the position of the device under test.

6. The enclosed probe station of claim 5, wherein the enclosure is made of materials capable of shielding against electromagnetic interference.

7. The enclosed probe station of claim 5, wherein the probe socket comprises a four-axis adjustable device for adjusting the probe.

8. The enclosed probe station of claim 5, further comprising a moving member for moving the guidance member.

9. The enclosed probe station of claim 5, wherein the guidance member is a slide rail.

10. The enclosed probe station of claim 5, further comprising a microscope assembly 500 configured to observe the position of the device under test through the transparent cover.

* * * * *